United States Patent
Redfern et al.

(10) Patent No.: US 9,054,736 B2
(45) Date of Patent: Jun. 9, 2015

(54) METHOD AND APPARATUS FOR ANALOG TO DIGITAL CONVERSION

(71) Applicant: Texas Instruments Incorporated, Dallas, TX (US)

(72) Inventors: Arthur John Redfern, Plano, TX (US); Kun Shi, Austin, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/100,578

(22) Filed: Dec. 9, 2013

(65) Prior Publication Data

US 2014/0159931 A1    Jun. 12, 2014

Related U.S. Application Data

(60) Provisional application No. 61/734,502, filed on Dec. 7, 2012.

(51) Int. Cl.
| | |
|---|---|
| *H03M 3/00* | (2006.01) |
| *H03M 1/12* | (2006.01) |
| *H03M 1/00* | (2006.01) |
| *H04B 1/40* | (2006.01) |

(52) U.S. Cl.
CPC ............. *H03M 3/422* (2013.01); *H03M 1/12* (2013.01); *H03M 3/30* (2013.01); *H03M 1/00* (2013.01); *H04B 1/40* (2013.01); *H03M 3/468* (2013.01); *H03M 3/322* (2013.01)

(58) Field of Classification Search
CPC ........... H03M 3/30; H03M 1/00; H03M 1/12; H04B 1/40

USPC ........... 341/143, 155, 110, 118, 136; 375/219
See application file for complete search history.

(56) References Cited

U.S. PATENT DOCUMENTS

2007/0241950 A1 * 10/2007 Petilli et al. .................. 341/143

OTHER PUBLICATIONS

Redfern et al., Arthur J., "Quantization Noise Shaping for Information Maximizing ADCs", arXiv:1305.2801 [cs.IT], May 13, 2013, pp. 1-4, V1, arXiv, USA.
Cormier et al., R., "Combining Subband Decomposition and Sigma Delta Modulation for Wideband A/D Conversion", IEEE Symposium on Circuits and Systems, May 30-Jun. 2, 1994, pp. 357-360, vol. 5, IEEE, London, England.
Hoyos et al., S. Hoyos, "Ultra-Wideband Analog-to-Digital Conversion via Signal Expansion," IEEE Transactions on Vehicular Technology, Sep. 2005, pp. 1609-1622, vol. 54, No. 5, IEEE, Dallas, TX, USA.
Wang et al., F., "Wideband Receiver Design in the Presence of Strong Narrowband Interference," IEEE Communications Letters, Jul. 2008, pp. 484-486, vol. 12, No. 7., IEEE, Shandong, China.
Yang et al., F., "Design of Frequency Domain A/D Conversion Based UWB Receiver in the Presence of Quantization Noise," International Conference on Communications, Circuits and Systems, May 2008, pp. 314-318, IEEE, Fujjan, China.

(Continued)

*Primary Examiner* — Joseph Lauture
(74) *Attorney, Agent, or Firm* — Michael A. Davis, Jr.; Frank D. Cimino (57) ABSTRACT

An analog to digital converter receives an analog input signal. The analog input signal is converted into a digital output signal. The converting includes shaping quantization noise in response to: a signal-to-noise ratio of the analog input signal; and a power of the converter.

38 Claims, 5 Drawing Sheets

(56) References Cited

OTHER PUBLICATIONS

Murmann, B., "Aid Converter Trends: Power Dissipation, Scaling and Digitally Assisted Architectures," IEEE Custom Integrated Circuits Conference, Sep. 2008, pp. 105-112, IEEE, San Jose, CA, USA.

Rosa, J. M., "Sigma-Delta Modulators: Tutorial Overview, Design Guide, and State-of-the-Art Survey," IEEE Transactions on Circuits and Systems—I: Regular Papers, Jan. 2011, pp. 1-21, vol. 58, issue 1, IEEE, Seville, Spain.

Murmann, B., "ADC Performance Survey", ISSCC & VLSI Symposium, 1997-2013, http://www.stanford.edu/~murmann/adcsurvey.html, Stanford University, Stanford, CA, USA.

Boyd et al., S., "Convex Optimization", Mar. 8, 2004, pp. 1-716, Cambridge University Press, Cambridge, UK.

Kirolos et al., S., "Analog-to-Information Conversion via Random Demodulation," IEEE CAS Workshop on DAIS, Oct. 2006, pp. 71-74, Richardson, TX, USA.

Jarman, David, "A Brief Introduction to Sigma Delta Conversion", Intersil Application Note AN9504, May 1995, pp. 1-7, Melbourne, FL, USA.

Shannon, C., "Communication in the Presence of Noise," Proceedings of the IEEE, Feb. 1998, pp. 447-457, vol. 86, No. 2.

\* cited by examiner

METHOD AND APPARATUS FOR ANALOG TO DIGITAL CONVERSION

CROSS-REFERENCE TO RELATED APPLICATION

This application claims priority to U.S. Provisional Patent Application Ser. No. 61/734,502, filed Dec. 7, 2012, entitled QUANTIZATION NOISE SHAPING FOR INFORMATION MAXIMIZING ADCs, naming Arthur John Redfern et al. as inventors, which is hereby fully incorporated herein by reference for all purposes.

BACKGROUND

The disclosures herein relate in general to electronic circuitry, and in particular to a method and apparatus for analog to digital conversion.

In an electronic device, an analog to digital converter ("ADC") may operate as an interface between analog and digital components, so the ADC outputs information to the digital components for processing. By sampling at higher frequency with more bits, the ADC may convert a larger contiguous block of frequencies with greater resolution, but consumes more ADC power $P_{ADC} \propto \Delta f \cdot 2^b$, where $\Delta f$ is the bandwidth and b is the number of bits. By consuming more ADC power, the electronic device is more likely to exceed a constrained power budget.

SUMMARY

An analog to digital converter receives an analog input signal. The analog input signal is converted into a digital output signal. The converting includes shaping quantization noise in response to: a signal-to-noise ratio of the analog input signal; and a power of the converter.

DETAILED DESCRIPTION

Figure 1:
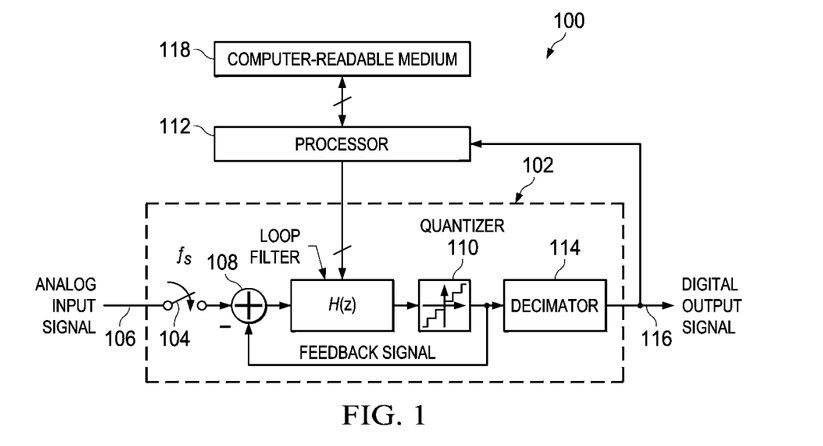
FIG. 1 is a block diagram of a first version of apparatus, which includes an example single-channel ADC, of the illustrative embodiments.

FIG. 1 is a block diagram of a first version, indicated generally at 100, of apparatus of the illustrative embodiments. The first version 100 includes an example single-channel ADC, indicated by dashed enclosure 102. In this example, the ADC 102 is a delta sigma ADC (e.g., delta sigma modulator). A switch 104: (a) receives an analog input signal via a single channel 106; and (b) at a sampling frequency $f_s$, connects the analog input signal to a summing junction 108. The summing junction 108: (a) receives the analog input signal via the switch 104; (b) receives a feedback signal from a quantizer 110; and (c) outputs a difference between the analog input signal and the feedback signal.

A loop filter H(z) receives such difference from the summing junction 108. In response to suitable control signals from a processor 112, the loop filter H(z) selectively filters such difference (and outputs the filtered difference to the quantizer 110) to achieve shaping of quantization noise (or "quantization error") as discussed hereinbelow in connection with FIGS. 2A through 7, so that: (a) gain is relatively large inside a signal band and relatively small outside the signal band to allow the analog input signal and the feedback signal to match relatively closely within the signal band; and (b) most of the difference output from the summing junction 108 occurs at higher frequencies and generates a shaped quantization noise whose power is pushed outside the signal band. Accordingly, shaping of quantization noise (resulting from quantization by the quantizer 110) is achieved by operation of the loop filter H(z) in response to suitable control signals from the processor 112.

The quantizer 110: (a) receives the filtered difference from the loop filter H(z); (b) in response thereto, quantizes the filtered difference to generate the feedback signal; and (c) outputs the feedback signal to the summing junction 108, as error feedback for the loop filter H(z) to improve the ADC 102 operation. The quantizer 110 generates and outputs the feedback signal in a stepped manner, in response to the filtered difference. For example, in one embodiment, in response to the filtered difference exceeding a threshold, the quantizer 110 adjusts the feedback signal by a predetermined amount. In one version of such embodiment, the quantizer 110: (a) increases the feedback signal by the predetermined amount in response to the filtered difference being positive beyond the threshold; and (b) reduces the feedback signal by the predetermined amount in response to the filtered difference being negative beyond the threshold.

A decimator 114: (a) receives the feedback signal from the quantizer 110; (b) downsamples the feedback signal (e.g., according to a decimation ratio); and (c) in response thereto, generates and outputs a digital output signal via a single channel 116. The digital output signal is proportional to the downsampled feedback signal. For example, in one embodiment, the decimator 114 generates and outputs a digital pulse stream whose frequency of pulses is proportional to the downsampled feedback signal's voltage. In that manner, the ADC 102 converts the analog input signal into the digital output signal.

The processor 112 receives the digital output signal. In response to the digital output signal, the processor 112 generates and outputs suitable control signals to the loop filter H(z) for achieving shaping of quantization noise as discussed hereinbelow in connection with FIGS. 2A through 7. The processor 112 performs those operations by executing instructions of computer-readable programs, which are stored on a computer-readable medium 118 (e.g., nonvolatile storage device and/or flash memory) coupled to the processor 112. Also, the computer-readable medium 118 stores other information (e.g., database) for the processor 112 to read and write in performing those operations.

Figure 2A:
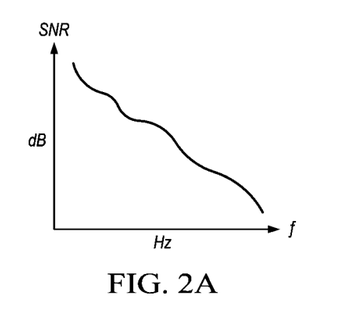
FIG. 2A is a graph of signal-to-noise ratio ("SNR") of a received signal ("received signal SNR") as a function of frequency for an example wireline channel.
Figure 2B:
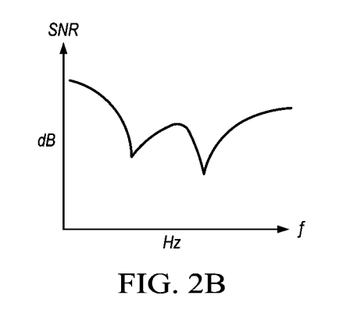
FIG. 2B is a graph of received signal SNR as a function of frequency for an example wireless channel.

FIG. 2A is a graph of the analog input signal's SNR ("received signal SNR") as a function of frequency for an example wireline channel. FIG. 2B is a graph of received signal SNR as a function of frequency for an example wireless channel. Accordingly, in these examples, the analog input signal ("received signal") resides within a contiguous band of frequencies, but the received signal's information content varies as a function of frequency.

The channels of FIGS. 2A and 2B are part of a multicarrier communication system with bit loading, where: (a) large constellation sizes are used in high SNR regions; and (b) small constellation sizes are used in low SNR regions. For those channels, a conventional ADC's resolution could have a number of bits capable of supporting the largest constellation size across the entire band. However, such number of bits would be power inefficient in the low SNR regions, because such number is more than necessary for the received signal's information content in the low SNR regions.

Also, quantization noise results in a nonuniform degradation of the received signal SNR. For example, an amount of quantization noise added to a high SNR region results in a first degradation. By comparison, the same amount of quantization noise added to a low SNR region results in a second degradation, which is less than the first degradation.

Unlike the conventional ADC, the ADC 102 is more efficient (e.g., under a constrained power budget), because the ADC 102 (in response to suitable control signals from the processor 112) shapes the quantization noise PSD to substantially maximize information content in the ADC 102's digital output signal, according to how the received signal's information content varies as a function of frequency.

Before the ADC 102 receives the signal, when the signal and noise are uncorrelated and the noise is additive colored Gaussian, the maximum information in a signal occupying frequencies $f_A$ through $f_B$ is $$C_b = \int_{f_A}^{f_B} \log_2\left[1 + \frac{S_x(f)}{S_v(f)}\right] df \tag{1}$$

where f is frequency, $S_x(f)$ is the signal PSD, and $S_v(f)$ is the noise PSD.

Modeling the effect of the ADC as adding shaped quantization noise PSD $S_q(f)$ to the signal, the maximum information in the ADC's digital output signal is $$C_a \approx \int_{f_A}^{f_B} \log_2\left[1 + \frac{S_x(f)}{S_v(f) + S_q(f)}\right] df \tag{2}$$

where the approximation is due to the quantization noise having a uniform probability density function ("PDF") and signal correlation.

The loss of information due to the ADC is found by subtracting equation (2) from equation (1)

$$C_\Delta = C_b - C_a \approx \int_{f_A}^{f_B} \log_2\left[1 + \frac{S_q(f)}{S_v(f)}\right] df \tag{3}$$

and assuming that the noise PSDs $S_q(f)$ and $S_v(f)$ are small relative to the signal PSD $S_x(f)$.

While small, the quantization noise is not arbitrarily small or 0, because the ADC is limited in power. The quantization noise PSD and number of bits are related by $$S_q(f) = 2^{-2b(f)}/12 \tag{4}$$

and the ADC power and number of bits are related by $$P_{ADC} = \frac{1}{c}\int_{f_A}^{f_B} 2^{b(f)} df, \tag{5}$$

where c is a proportionality constant that (for convenience) may be absorbed in the definition of $P \equiv cP_{ADC}$. Using equations (4) and (5), the quantization noise PSD and the ADC power are related as $$\int_{f_A}^{f_B} S_q^{-\frac{1}{2}}(f) = \sqrt{12}\, P. \tag{6}$$

As the quantization noise becomes smaller, the ADC's power becomes larger.

To determine the optimal quantization noise PSD shape, which minimizes the equation (3) information loss of the ADC's digital output signal, given the equation (6) power constraint, integrals are converted into Riemann sums by dividing the band from $f_A$ to $f_B$ into K subchannels of bandwidth $(f_B-f_A)/K$ indexed by $k=1, \ldots, K$ and forming the Lagrangian $$J[\lambda, S_q(k)] = \tag{7}$$
$$\frac{f_B - f_A}{K}\sum_{k=1}^{K}\log_2\left[1 + \frac{S_q(k)}{S_v(k)}\right] + \lambda\left(\frac{1}{K}\sum_{k=1}^{K} S_q^{-\frac{1}{2}}(k) - \frac{\sqrt{12}\,P}{f_B - f_A}\right),$$

where $\lambda$ is a Lagrange multiplier. As both the equation (3) information loss and the equation (6) power constraint are convex, their equation (7) sum is also convex.

By taking first order partial derivatives with respect to $S_q(k)$ and $\lambda$, setting the results to 0, and using the assumption that $S_q(f)$ is small relative to $S_v(f)$, a system of equations is created as follows.

$$\frac{\partial J}{\partial S_q(k)} = 0 \Rightarrow S_q^{-\frac{1}{2}}(k) \approx \frac{2(f_B - f_A)\log_2(e)}{\lambda}\frac{S_q(k)}{S_v(k)}, \tag{8}$$

$$\frac{\partial J}{\partial \lambda} = 0 \Rightarrow \frac{1}{K}\sum_{k=1}^{K} S_q^{-\frac{1}{2}}(k) = \frac{\sqrt{12}\,P}{f_B - f_A}. \tag{9}$$

By substituting equation (8) into equation (9), solving for $\lambda$, substituting the result into equation (8), and solving for $S_q(k)$, $$S_q(k) = S_v^{\frac{2}{3}}(k)\left[\frac{\frac{f_B - f_A}{K}\sum_{k=1}^{K}\frac{S_q(k)}{S_v(k)}}{\sqrt{12}\,P}\right]^{\frac{2}{3}}. \tag{10}$$

While equation (10) relates $S_q(k)$ to $S_v(k)$, it is somewhat cumbersome to use, because $S_q(k)$ occurs on both sides of the equation. The summation term with $S_q(k)$ on the right hand side is removed by forming an equivalent summation term on the left hand side, solving for the summation term, and substituting back into equation (10) to get $$S_q(k) = S_v^{\frac{2}{3}}(k) \left[ \frac{\frac{f_B - f_A}{K} \sum_{k=1}^{K} S_v^{-\frac{1}{3}}(k)}{\sqrt{12}\,P} \right]^2. \tag{11}$$

Letting $K \to \infty$ in equation (11) yields $$S_q(f) = S_v^{\frac{2}{3}}(f) \left[ \frac{\int_{f_A}^{f_B} S_v^{-\frac{1}{3}}(f)\,df}{\sqrt{12}\,P} \right]^2 \tag{12}$$

which explicitly relates the optimal quantization noise PSD shape to the signal noise PSD shape.

Considering equation (12) in more detail, the squared term in brackets on the right hand side is a constant, which is made smaller by increasing the ADC's power. Accordingly, the optimal quantization noise PSD shape is proportional to $S_v^{2/3}(f)$. Without the ⅔ power, the optimal quantization noise PSD would be a fixed offset from the noise PSD, regardless of the level of the noise PSD. The ⅔ power effectively shrinks the gap between the optimal quantization noise PSD and the noise PSD in low noise regions. In that manner, while additional power in the ADC is allocated to low noise frequencies relative to high noise frequencies, the amount of additional power is constrained.

Figure 3:
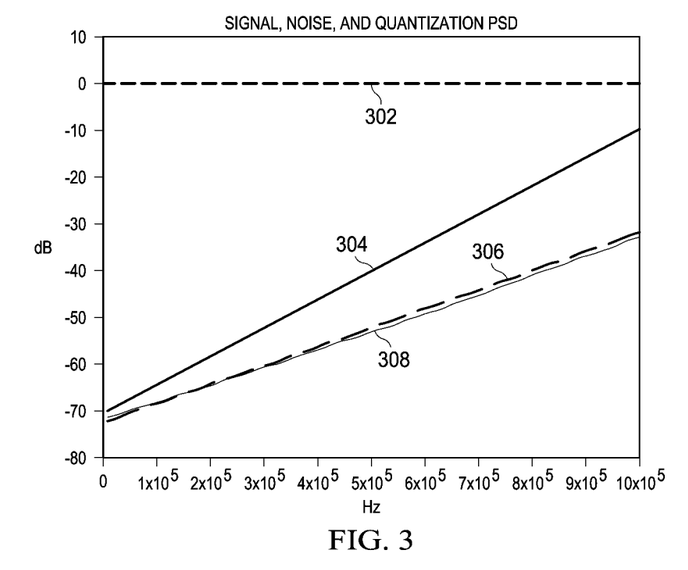
FIG. 3 is a graph of optimal quantization noise power spectral density ("PSD") to substantially maximize information in the single-channel ADC's digital output signal for a wireline style channel example.

FIG. 3 is a graph of optimal quantization noise PSD to substantially maximize information in the ADC 102's digital output signal for a wireline style channel example. For such example, FIG. 3 shows a signal curve 302 and a noise curve 304. A corresponding analytical (e.g., ideal) quantization noise PSD curve 306 was generated from equation (12). For comparison to the analytical quantization noise PSD curve 306, a numerical (e.g., actual) quantization noise PSD curve 308 was generated by a stochastic search technique that substantially minimizes equation (3) for a given equation (6) power constraint.

Figure 4:
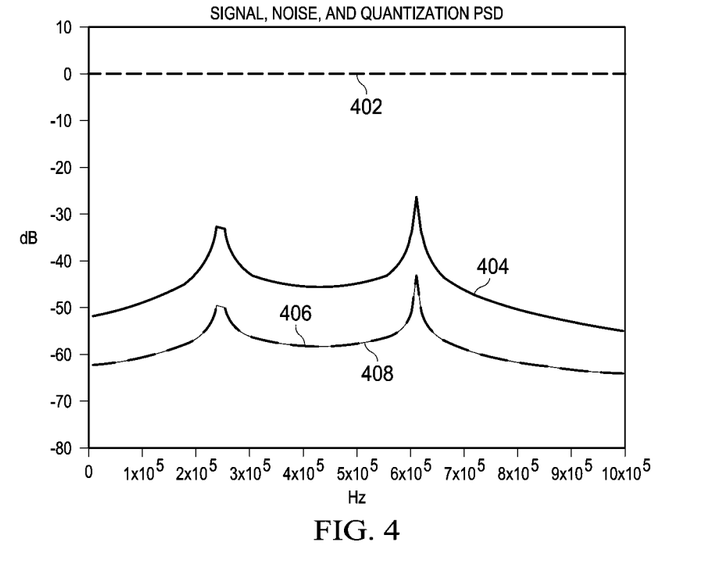
FIG. 4 is a graph of optimal quantization noise PSD to substantially maximize information in the single-channel ADC's digital output signal for a wireless style channel example.

FIG. 4 is a graph of optimal quantization noise PSD to substantially maximize information in the ADC 102's digital output signal for a wireless style channel example. For such example, FIG. 4 shows a signal curve 402 and a noise curve 404. A corresponding analytical quantization noise PSD curve 406 was generated from equation (12). For comparison to the analytical quantization noise PSD curve 406, a numerical quantization noise PSD curve 408 was generated by the stochastic search technique that substantially minimizes equation (3) for a given equation (6) power constraint.

In the illustrative embodiments, the processor 112 automatically computes the optimal quantization noise PSD shape according to equation (12), and generates and outputs suitable control signals to the loop filter H(z), so that the ADC 102 (in response to those control signals) suitably adjusts its feedback currents to substantially achieve the optimal quantization noise PSD shape. For example, in the embodiment of FIG. 1, the ADC 102 can be represented in the z domain by $$Y(z) = STF(z)X(z) + NTF(z)Q(z), \tag{130}$$

where: (a) X(z), Y(z) and Q(z) are the z transforms of the analog input signal, the digital output signal and the quantization error, respectively; and (b) STF(z) and NTF(z) are the signal and noise transfer functions given by $$STF(z) = \frac{H(z)}{1 + H(z)} \tag{14}$$

and $$NTF(z) = \frac{1}{1 + H(z)}.$$

Accordingly, in the embodiment of FIG. 1, the apparatus shapes the quantization noise PSD as $$S_q(f) = \frac{\Delta^2}{12 f_s} \left| NTF\!\left(z = e^{j 2\pi f / f_s}\right) \right|^2, \tag{15}$$

where $\Delta$ is the quantization step size, and $f_s$ is the sampling frequency. Such noise shaping is achieved by operation of the loop filter H(z) in response to suitable control signals from the processor 112.

Figure 5:
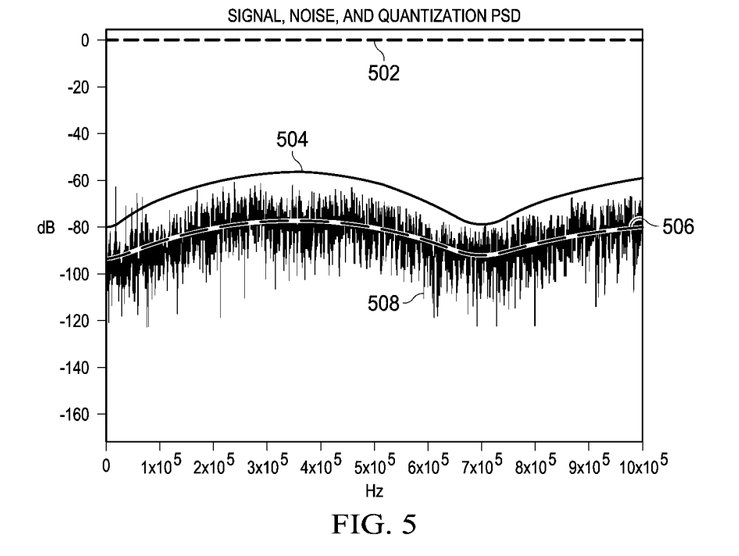
FIG. 5 is a graph of optimal quantization noise PSD to substantially maximize information in the single-channel ADC's digital output signal for a simulated wireless style channel example having a shaped noise spectrum.

FIG. 5 is a graph of optimal quantization noise PSD to substantially maximize information in the ADC 102's digital output signal for a simulated wireless style channel example having a shaped noise spectrum. For such example, FIG. 5 shows a signal curve 502 and a noise curve 504. A corresponding analytical quantization noise PSD curve 506 was generated from equation (12). For comparison to the analytical quantization noise PSD curve 506, a simulated quantization noise PSD curve 508 was generated by simulating a 4th order delta sigma ADC 102 whose oversampling ratio=12, and whose loop filter H(z) is optimized to achieve shaping of quantization noise according to equation (12).

Figure 6:
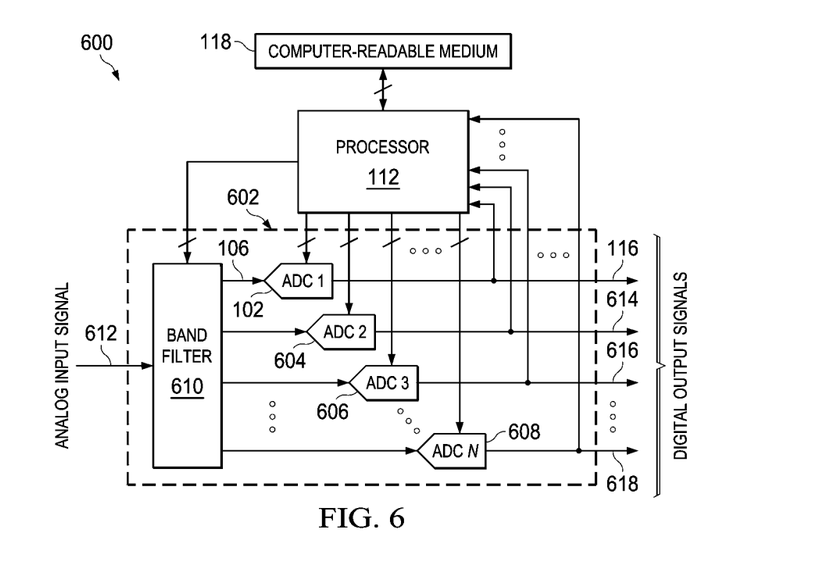
FIG. 6 is a block diagram of a second version of apparatus, which includes an example multichannel ADC, of the illustrative embodiments.

FIG. 6 is a block diagram of a second version, indicated generally at 600, of apparatus of the illustrative embodiments. The second version 600 includes an example multichannel ADC, indicated by dashed enclosure 602. In the example of FIG. 6, the ADC 602 includes a set of N single-channel ADCs respectively numbered from n=1 through N (where N is an integer number greater than 1), namely: (a) the ADC 102 (FIG. 1); and (b) ADCs 604, 606 and 608, each of which is substantially identical to the ADC 102. Together, the N single-channel ADCs form a time and frequency interleaved multichannel structure.

In time interleaving, the N single-channel ADCs (with appropriate time offsets and matching) are combined to form the ADC 602, so that the N single-channel ADCs' quantization noise PSD shapes combine to resemble an Nx bandwidth expanded version of the optimal quantization noise PSD shape.

In frequency interleaving, a band filter 610: receives an analog input signal via a single channel 612; and divides the analog input signal's total bandwidth into N contiguous bands respectively numbered from n=1 through N, so that each of the N single-channel ADCs has approximately the same equation (6) power. Accordingly, one or more of the N single-channel ADCs may receive a disproportionately wider (or narrower) band portion of the analog input signal's total bandwidth. In an alternative embodiment, the second version 600 is simplified by imposing a constraint that the N contiguous bands' respective widths are either: (a) equal to one another; or (b) related to one another by integer scale factors.

The band filter 610 performs such division in response to bandwidth selection signals from the processor 112.

From the band filter 610, the nth single-channel ADC receives the nth contiguous band portion of the analog input signal. For the nth single-channel ADC, the processor 112 automatically computes a respective optimal quantization noise PSD shape according to equation (12), and generates and outputs respective suitable control signals to the nth single-channel ADC's respective loop filter H(z), so that the nth single-channel ADC (in response to those control signals): (a) suitably adjusts its feedback currents to substantially achieve the optimal quantization noise PSD shape (for the nth contiguous band portion of the analog input signal); and (b) generates and outputs a respective nth digital output signal. In response to the N digital output signals from the N single-channel ADCs, the processor 112 generates and outputs those suitable control signals (to the N single-channel ADCs) and the bandwidth selection signals (to the band filter 610). In such computing of the respective optimal quantization noise PSD shape according to equation (12) for the nth single-channel ADC, the nth contiguous band portion of the analog input signal occupies frequencies $f_A$ through $f_B$, and P is a power of the nth single-channel ADC multiplied by the proportionality constant c.

Accordingly, the ADC 102 generates and outputs its respective digital output signal via the single channel 116. Similarly, the ADC 604 generates and outputs its respective digital output signal via a single channel 614. Likewise, ADC 606 generates and outputs its respective digital output signal via a single channel 616. Also, the ADC 608 generates and outputs its respective digital output signal via a single channel 618.

Figure 7:
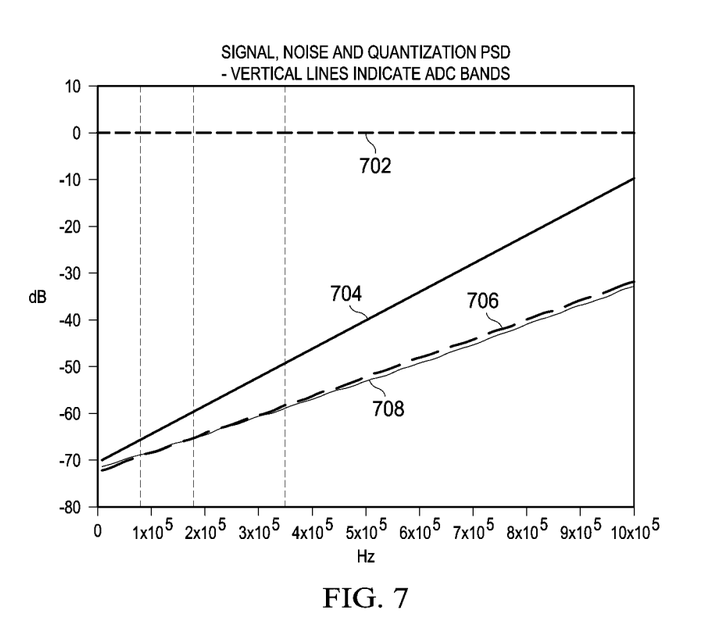
FIG. 7 is a graph of optimal quantization noise PSD to substantially maximize information in the multichannel ADC's digital output signals for a wireline style channel example.

FIG. 7 is a graph of optimal quantization noise PSD to substantially maximize information in the ADC 602's digital output signals for a wireline style channel example. In the example of FIG. 7, vertical lines indicate partitioning of total bandwidth to N=4 single-channel delta sigma ADCs, so that: (a) the respective equation (6) power is substantially equal for each single-channel delta sigma ADC (e.g., the ADC 102); and (b) information after the ADC 602 is substantially maximized. For such example, FIG. 7 shows a signal curve 702 and a noise curve 704. A corresponding analytical quantization noise PSD curve 706 was generated from equation (12). For comparison to the analytical quantization noise PSD curve 706, a numerical quantization noise PSD curve 708 was generated by the stochastic search technique that substantially minimizes equation (3) for a given equation (6) power constraint.

Unlike the ADC 602, for shaping the quantization noise PSD (and, accordingly, shaping the bits versus frequency profile), a conventional multichannel ADC may rely on having a sufficiently large number of single-channel ADCs, so that each single-channel ADC: (a) has its own constant bits versus frequency profile; and (b) does not significantly change the received signal SNR within its respective band portion of the analog input signal. Accordingly, such conventional multichannel ADC may be described as a block constant frequency shaping ADC.

In another example, if the received signal is sparse in frequency, then a compressive sensing ADC may recover an original signal sampling at a rate proportional to occupied signal bandwidth (e.g., instead of being proportional to total system bandwidth), by performing on/off shaping of the quantization noise PSD, so that: (a) 0 bits are assigned to frequencies having no signal; and (b) a constant number (greater than 0) of bits are assigned to frequencies having a signal. Accordingly, such ADC may be described as a block constant frequency shaping ADC, similar to the conventional multichannel ADC.

In the illustrative embodiments, the processor 112 includes one or more microprocessors and/or digital signal processors ("DSPs"). Also, the first version 100 and the second version 600 include various other electronic circuitry components, implemented in a suitable combination of hardware, firmware and software, such as one or more discrete logic devices, application specific integrated circuits ("ASICs"), and field-programmable gate arrays ("FPGAs").

A computer program product is an article of manufacture that has: (a) a computer-readable medium (e.g., the computer-readable medium 118); and (b) a computer-readable program that is stored on such medium. Such program is processable (e.g., executable) by an instruction execution apparatus (e.g., programmable information handling system, including the processor 112) for causing the apparatus to perform its operations discussed hereinabove (e.g., discussed in connection with a block diagram). For example, in response to processing (e.g., executing) such program's instructions, the apparatus performs its operations discussed hereinabove, so that such operations are at least partially computer-implemented.

Such program (e.g., software, firmware, and/or microcode) is written in one or more programming languages, such as: an object-oriented programming language (e.g., C++); a procedural programming language (e.g., C); and/or any suitable combination thereof. In a first example, the computer-readable medium is a computer-readable storage medium. In a second example, the computer-readable medium is a computer-readable signal medium.

A computer-readable storage medium includes any system, device and/or other non-transitory tangible apparatus (e.g., electronic, magnetic, optical, electromagnetic, infrared, semiconductor, and/or any suitable combination thereof) that is suitable for storing a program, so that such program is processable by an instruction execution apparatus for causing the apparatus to perform its operations discussed hereinabove. Examples of a computer-readable storage medium include, but are not limited to: an electrical connection having one or more wires; a portable computer diskette; a hard disk; a random access memory ("RAM"); a read-only memory ("ROM"); an erasable programmable read-only memory ("EPROM" or flash memory); an optical fiber; a portable compact disc read-only memory ("CD-ROM"); an optical storage device; a magnetic storage device; and/or any suitable combination thereof.

A computer-readable signal medium includes any computer-readable medium (other than a computer-readable storage medium) that is suitable for communicating (e.g., propagating or transmitting) a program, so that such program is processable by an instruction execution apparatus for causing the apparatus to perform its operations discussed hereinabove. In one example, a computer-readable signal medium includes a data signal having computer-readable program code embodied therein (e.g., in baseband or as part of a carrier wave), which is communicated (e.g., electronically, electromagnetically, and/or optically) via wireline, wireless, optical fiber cable, and/or any suitable combination thereof.

Although illustrative embodiments have been shown and described by way of example, a wide range of alternative embodiments is possible within the scope of the foregoing disclosure.

What is claimed is:

1. Apparatus for analog to digital conversion, comprising:
an analog to digital converter ("ADC") for receiving an analog input signal, converting the analog input signal into a digital output signal, and outputting the digital output signal via a single channel, wherein the converter is a single-channel converter, and wherein the converting includes shaping quantization noise in response to: a signal-to-noise ratio of the analog input signal; and a power of the converter.

2. The apparatus of claim 1, wherein the converter includes a loop filter, and wherein the shaping includes shaping the quantization noise with the loop filter.

3. The apparatus of claim 2, wherein the converter is a delta sigma ADC.

4. The apparatus of claim 1, wherein the shaping includes shaping the quantization noise to substantially maximize information content in the digital output signal.

5. The apparatus of claim 1, and comprising:
a processor for: computing a shape of quantization noise power spectral density ("PSD"); and generating and outputting control signals to the converter in response thereto; wherein the shaping includes shaping the quantization noise in response to the control signals.

6. The apparatus of claim 5, wherein the computing includes computing the shape of quantization noise PSD in response to the digital output signal.

7. The apparatus of claim 5, wherein the computing includes computing the shape of quantization noise PSD according to:

$$S_q(f) = S_v^{\frac{2}{3}}(f)\left[\frac{\int_{f_A}^{f_B} S_v^{-\frac{1}{3}}(f)\,df}{\sqrt{12\,P}}\right]^2;$$

wherein $S_q(f)$ is the quantization noise PSD as a function of frequency f, $S_v(f)$ is a signal noise PSD as a function of frequency f, the analog input signal occupies frequencies $f_A$ through $f_B$, and P is the power multiplied by a proportionality constant.

8. The apparatus of claim 5, wherein the converter includes a loop filter, and wherein the shaping includes shaping the quantization noise with the loop filter in response to the control signals.

9. The apparatus of claim 1, wherein the power is a linear function of a bandwidth of the analog input signal.

10. The apparatus of claim 1, wherein the power is an exponential function of a number of bits of resolution in the converting.

11. A method of analog to digital conversion, the method comprising:
with an analog to digital converter ("ADC"), receiving an analog input signal, converting the analog input signal into a digital output signal, and outputting the digital output signal via a single channel, wherein the converter is a single-channel converter, and wherein the converting includes shaping quantization noise in response to: a signal-to-noise ratio of the analog input signal; and a power of the converter.

12. The method of claim 11, wherein the shaping includes shaping the quantization noise with a loop filter of the converter.

13. The method of claim 12, wherein the converter is a delta sigma ADC.

14. The method of claim 11, wherein the shaping includes shaping the quantization noise to substantially maximize information content in the digital output signal.

15. The method of claim 11, and comprising:
computing a shape of quantization noise power spectral density ("PSD"); and generating and outputting control signals to the converter in response thereto; wherein the shaping includes shaping the quantization noise in response to the control signals.

16. The method of claim 15, wherein the computing includes computing the shape of quantization noise PSD in response to the digital output signal.

17. The method of claim 15, wherein the computing includes computing the shape of quantization noise PSD according to:

$$S_q(f) = S_v^{\frac{2}{3}}(f)\left[\frac{\int_{f_A}^{f_B} S_v^{-\frac{1}{3}}(f)\,df}{\sqrt{12\,P}}\right]^2;$$

wherein $S_q(f)$ is the quantization noise PSD as a function of frequency f, $S_v(f)$ is a signal noise PSD as a function of frequency f, the analog input signal occupies frequencies $f_A$ through $f_B$, and P is the power multiplied by a proportionality constant.

18. The method of claim 15, wherein the shaping includes shaping the quantization noise with a loop filter of the converter in response to the control signals.

19. The method of claim 11, wherein the power is a linear function of a bandwidth of the analog input signal.

20. The method of claim 11, wherein the power is an exponential function of a number of bits of resolution in the converting.

21. Apparatus for analog to digital conversion, comprising:
a multichannel analog to digital converter ("ADC") for receiving an analog input signal and dividing a bandwidth of the analog input signal into N contiguous bands respectively numbered from n=1 through N, wherein the multichannel ADC includes at least N single-channel ADCs respectively numbered from n=1 through N, wherein N is an integer number greater than 1;
wherein the nth single-channel ADC is for receiving the nth contiguous band portion of the analog input signal, converting the nth contiguous band portion into an nth digital output signal, and outputting the nth digital output signal via an nth single channel, wherein the converting by the nth single-channel ADC includes shaping quantization noise in response to: a signal-to-noise ratio of the nth contiguous band portion; and a power of the nth single-channel ADC.

22. The apparatus of claim 21, wherein the nth single-channel ADC includes a respective loop filter, and wherein the shaping includes shaping the quantization noise with the respective loop filter.

23. The apparatus of claim 22, wherein the N single-channel ADCs are delta sigma ADCs.

24. The apparatus of claim 21, wherein the shaping by the nth single-channel ADC includes shaping the quantization noise to substantially maximize information content in the nth digital output signal.

25. The apparatus of claim 21, and comprising:
a processor for: computing shapes of quantization noise power spectral density ("PSD"); and generating and outputting respective control signals to the N single-channel ADCs in response thereto; wherein the shaping by the nth single-channel ADC includes shaping the quantization noise in response to its respective control signals.

26. The apparatus of claim 25, wherein the computing includes computing the shapes of quantization noise PSD in response to the digital output signals.

27. The apparatus of claim 25, wherein the computing includes computing the shapes of quantization noise PSD according to:

$$S_q(f) = S_v^{\frac{2}{3}}(f)\left[\frac{\int_{f_A}^{f_B} S_v^{-\frac{1}{3}}(f)df}{\sqrt{12\,P}}\right]^2;$$

wherein $S_q(f)$ is the quantization noise PSD as a function of frequency f, $S_v(f)$ is a signal noise PSD as a function of frequency f, the nth contiguous band portion occupies frequencies $f_A$ through $f_B$, and P is a power of the nth single-channel ADC multiplied by a proportionality constant.

28. The apparatus of claim 25, wherein the nth single-channel ADC includes a respective loop filter, and wherein the shaping by the nth single-channel ADC includes shaping the quantization noise with the respective loop filter in response to its respective control signals.

29. The apparatus of claim 25, wherein the processor is for generating and outputting bandwidth selection signals in response to the digital output signals, and wherein dividing the bandwidth includes dividing the bandwidth in response to the bandwidth selection signals.

30. The apparatus of claim 29, wherein the N single-channel ADCs have respective powers that are approximately the same as one another.

31. The apparatus of claim 29, wherein respective widths of the N contiguous bands are related to one another by integer scale factors.

32. The apparatus of claim 21, wherein the power is a linear function of a bandwidth of the nth contiguous band portion.

33. The apparatus of claim 21, wherein the power is an exponential function of a number of bits of resolution in the converting.

34. Apparatus for analog to digital conversion, comprising:
an analog to digital converter ("ADC") for receiving an analog input signal, converting the analog input signal into a digital output signal, and outputting the digital output signal via a single channel; and
a processor for: in response to the digital output signal, computing a shape of quantization noise power spectral density ("PSD"); and generating and outputting control signals in response thereto;
wherein the converter is a single-channel delta sigma converter including a loop filter, and wherein the converting includes shaping quantization noise with the loop filter in response to the control signals to substantially maximize information content in the digital output signal.

35. The apparatus of claim 34, wherein the converting includes shaping quantization noise in response to: a signal-to-noise ratio of the analog input signal; and a power of the converter.

36. The apparatus of claim 35, wherein the power is a linear function of a bandwidth of the analog input signal.

37. The apparatus of claim 36, wherein the power is an exponential function of a number of bits of resolution in the converting.

38. The apparatus of claim 37, wherein the computing includes computing the shape of quantization noise PSD according to:

$$S_q(f) = S_v^{\frac{2}{3}}(f)\left[\frac{\int_{f_A}^{f_B} S_v^{-\frac{1}{3}}(f)df}{\sqrt{12\,P}}\right]^2;$$

wherein $S_q(f)$ is the quantization noise PSD as a function of frequency f, $S_v(f)$ is a signal noise PSD as a function of frequency f, the analog input signal occupies frequencies $f_A$ through $f_B$, and P is the power multiplied by a proportionality constant.

* * * * *